United States Patent [19]
Erk et al.

[11] Patent Number: 5,626,159
[45] Date of Patent: May 6, 1997

[54] APPARATUS FOR CLEANING SEMICONDUCTOR WAFERS

[75] Inventors: Henry F. Erk, St. Louis; Ronald D. Bartram, Webster Groves; Eugene R. Hollander, Wentzville; Jing Chai, St. Charles, all of Mo.

[73] Assignee: MEMC Electronic Materials, Inc., St. Peters, Mo.

[21] Appl. No.: 686,367

[22] Filed: Jul. 25, 1996

Related U.S. Application Data

[62] Division of Ser. No. 424,904, Apr. 19, 1995.

[51] Int. Cl.$^6$ ................................................. B08B 3/12
[52] U.S. Cl. ........................... 134/147; 134/161; 134/902
[58] Field of Search ................................. 134/902, 147, 134/161

[56] References Cited

U.S. PATENT DOCUMENTS

| | | | |
|---|---|---|---|
| 4,804,007 | 2/1989 | Bran | 134/184 |
| 4,854,337 | 8/1989 | Bunkenburg et al. | 134/184 |
| 4,869,278 | 9/1989 | Bran | 134/184 |
| 4,902,350 | 2/1990 | Steck | 134/902 X |
| 5,071,776 | 12/1991 | Matsushita et al. | 134/1 X |
| 5,090,432 | 2/1992 | Bran | 134/139 |
| 5,143,103 | 9/1992 | Basso et al. | 134/1 X |
| 5,203,798 | 4/1993 | Watanabe et al. | 134/184 |
| 5,279,316 | 1/1994 | Miranda | 134/102.1 |
| 5,286,657 | 2/1994 | Bran | 134/902 X |
| 5,327,921 | 7/1994 | Mokuo et al. | 134/182 |
| 5,468,302 | 11/1995 | Thietje | 134/1 |

FOREIGN PATENT DOCUMENTS

| | | | |
|---|---|---|---|
| 54-69260 | 4/1979 | Japan . | |
| 97836 | 5/1986 | Japan | 134/902 |
| 61-247034 | 11/1986 | Japan | 134/902 |
| 304733 | 12/1989 | Japan | 134/902 |
| 231428 | 10/1991 | Japan | 134/902 |
| 3-257826 | 11/1991 | Japan . | |
| 55192 | 3/1993 | Japan | 134/902 |

OTHER PUBLICATIONS

Cyrus Glickstein, Acoustica Associates, Inc., "Basic Ultrasonics", Apr. 1960, p. 93.

*Primary Examiner*—Philip R. Coe
*Attorney, Agent, or Firm*—Senniger, Powers, Leavitt & Roedel

[57] ABSTRACT

A method of cleaning a semiconductor wafer comprises placing liquid in a bath with a gas-liquid-interface defined at the surface of the liquid. A semiconductor wafer is placed in the bath so that it is oriented in a generally upright position with at least part of the wafer being in the liquid and below the gas-liquid-interface. Sonic energy is directed through the liquid. At least one of the position of the semiconductor wafer and the level of liquid in the bath relative to the semiconductor wafer is varied so that the entire surface of the wafer repeatedly passes through the gas-liquid-interface.

18 Claims, 5 Drawing Sheets

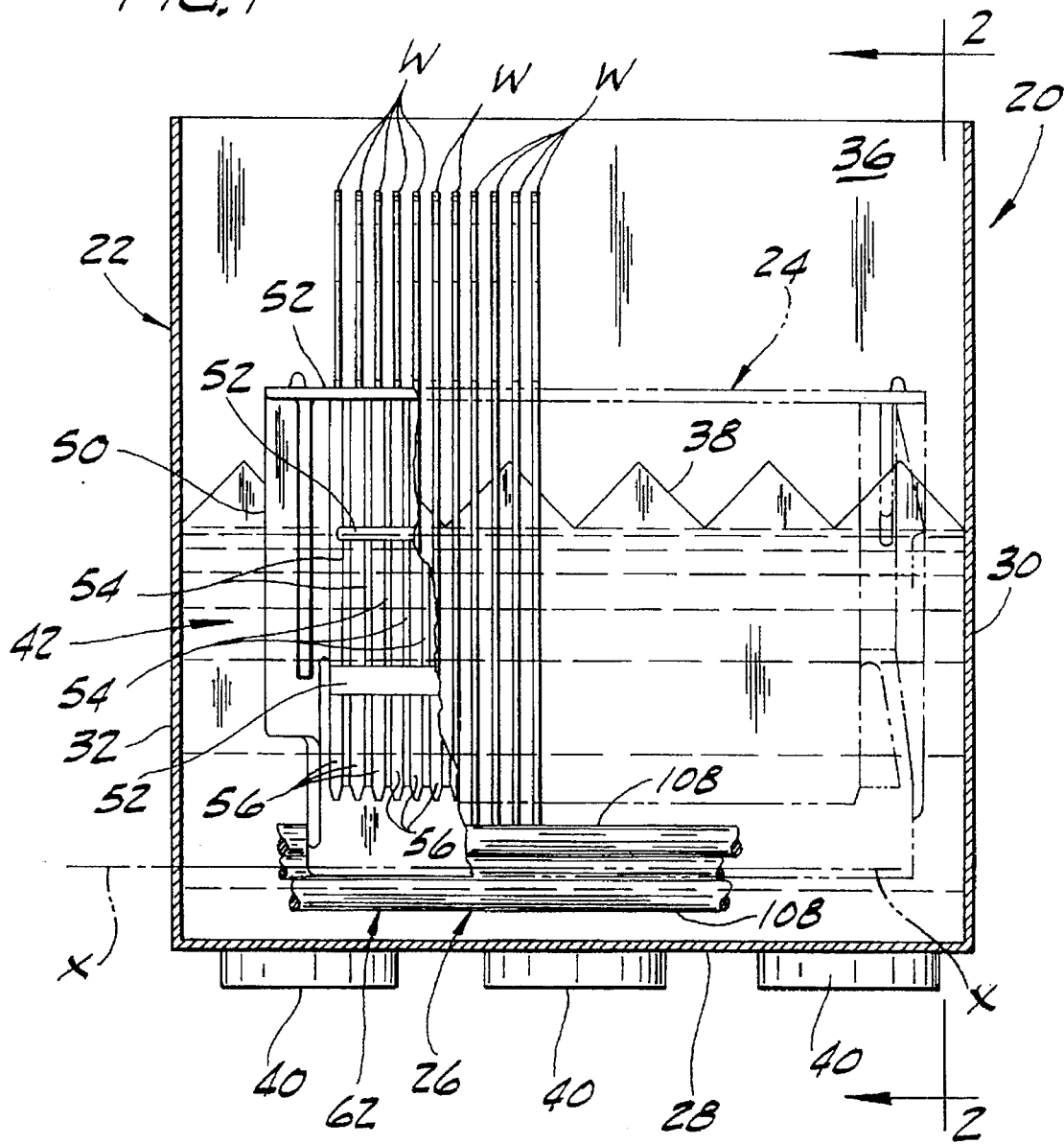

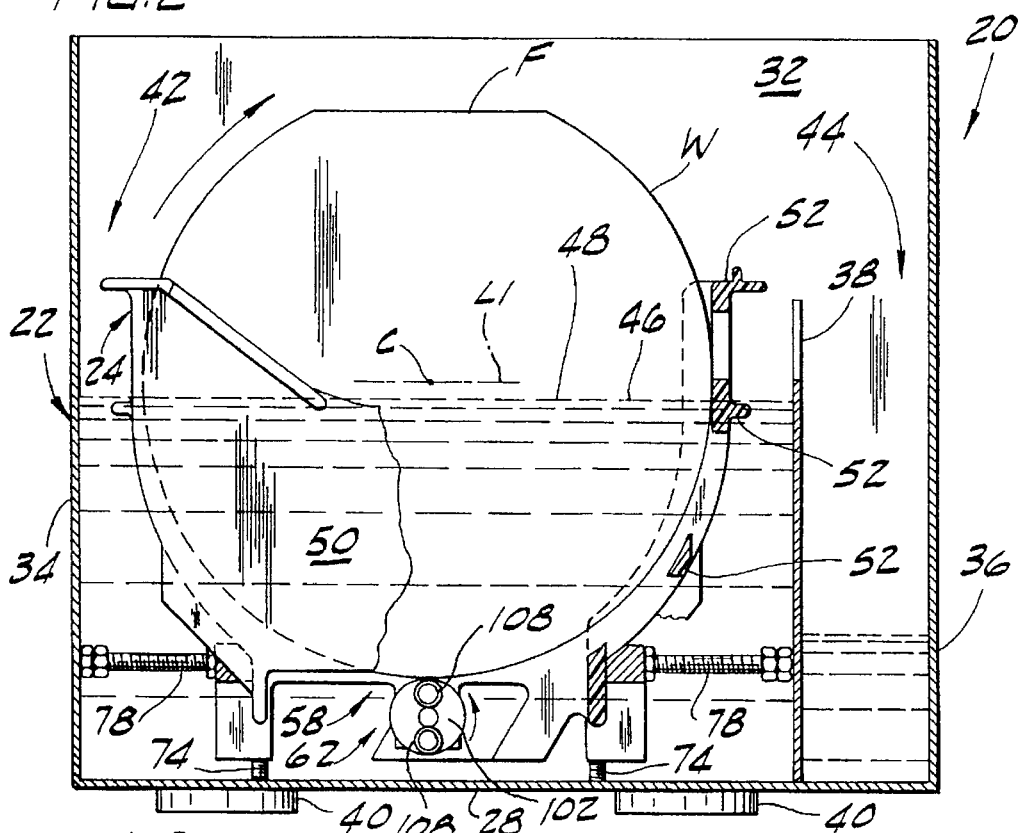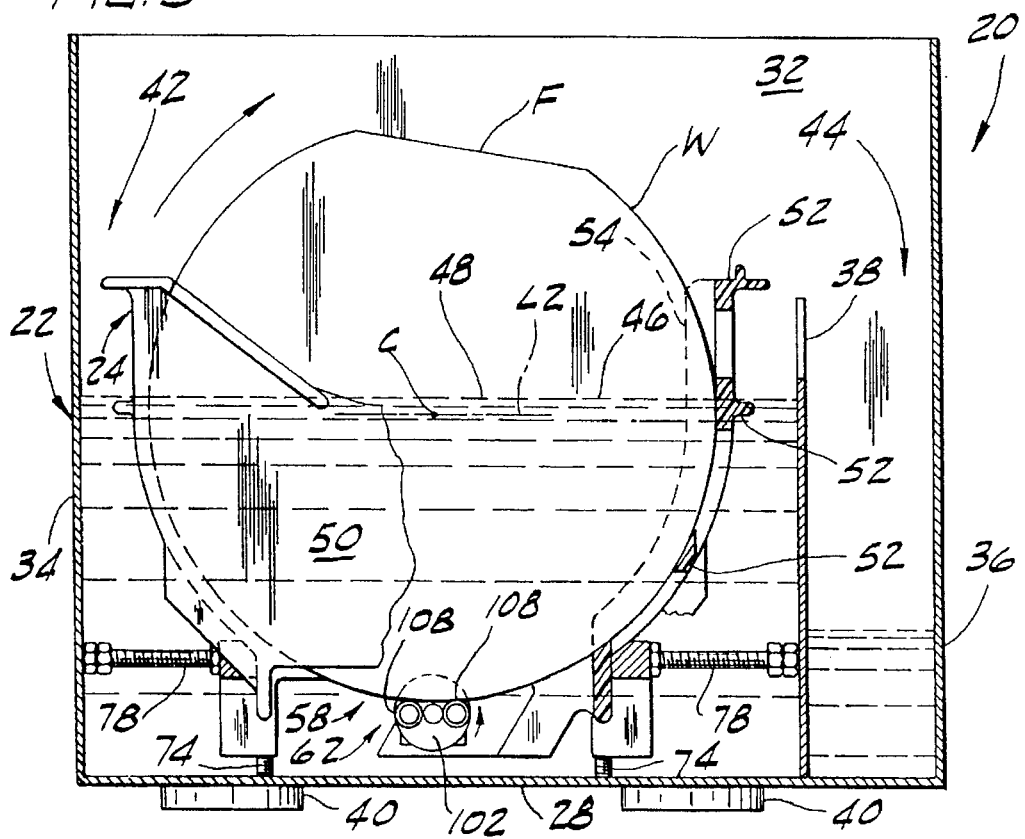

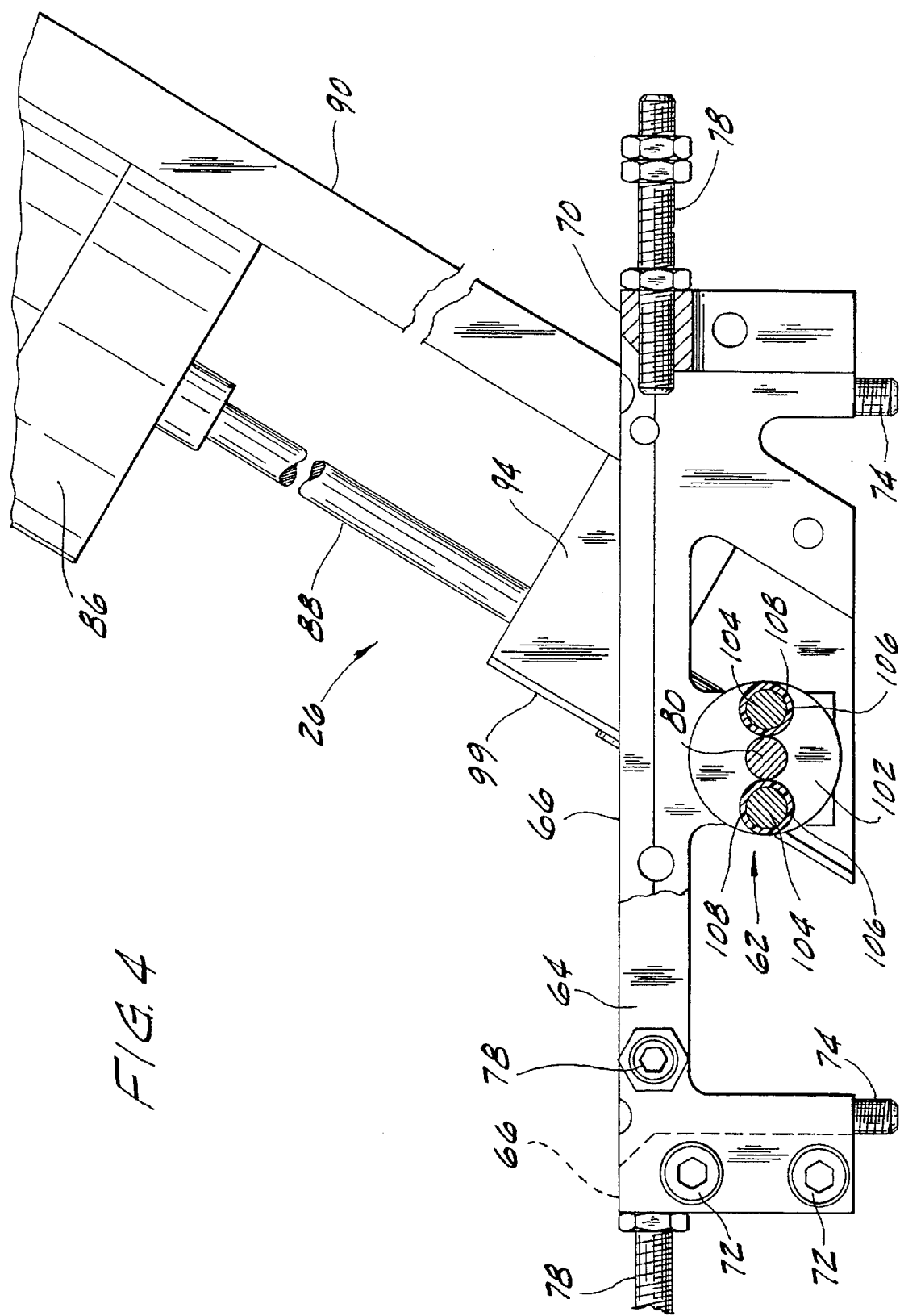

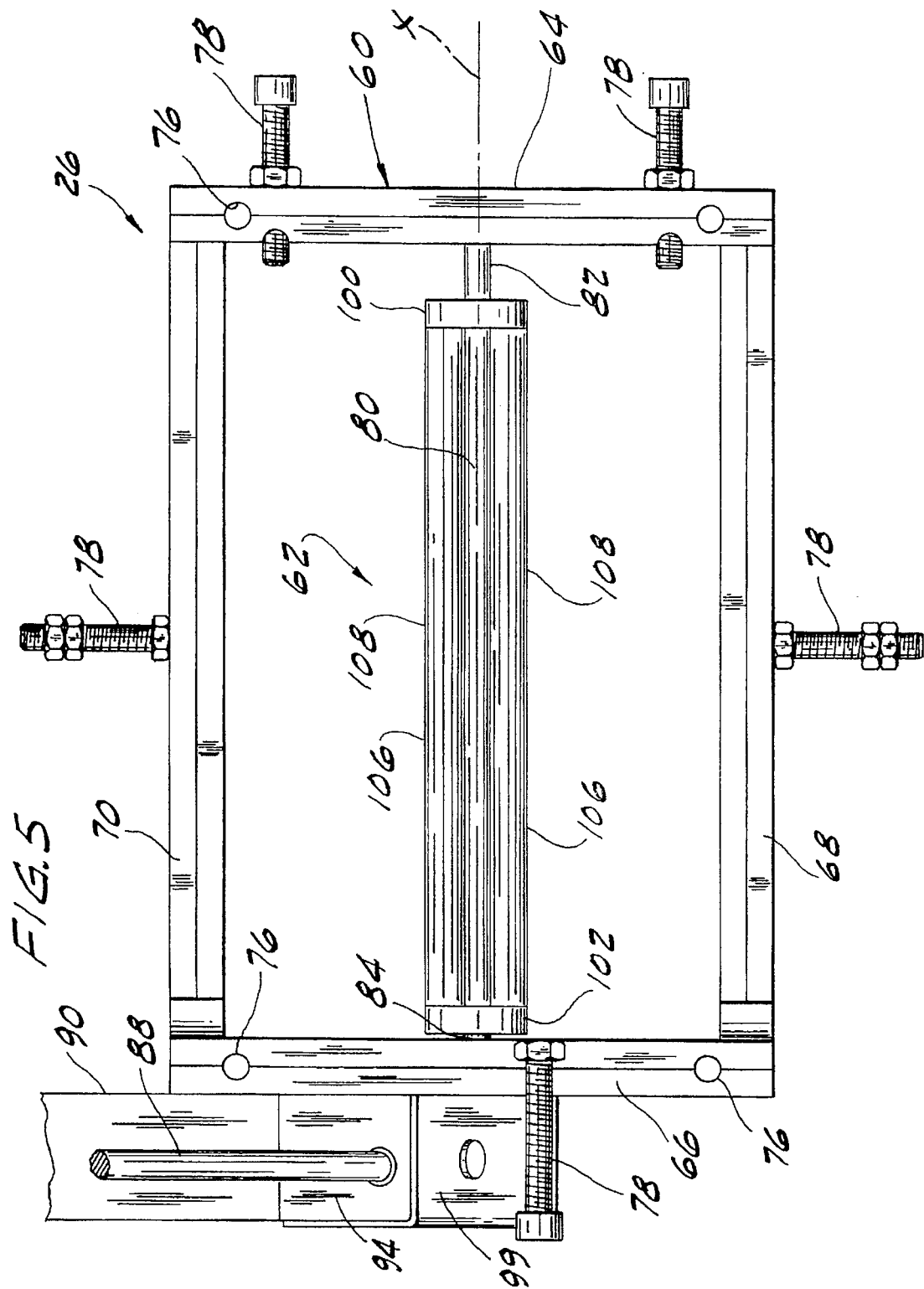

APPARATUS FOR CLEANING SEMICONDUCTOR WAFERS

This is a division of application Ser. No. 08/424,904, filed Apr. 4, 1995, pending.

BACKGROUND OF THE INVENTION

This invention relates to cleaning of semiconductor wafers.

Semiconductor wafers for the microelectronics industry are produced by first slicing thin wafers from a crystal ingot. After slicing, the wafers undergo a lapping process to give them a somewhat uniform thickness. The wafers are then etched to remove damage and produce a smooth surface. The final step in a conventional semiconductor wafer shaping process is a polishing step to produce a highly reflective and damage-free surface on at least one face of the semiconductor wafer.

The wafers must be cleaned between the lapping and etching steps to remove contaminants such as lapping grit. If the cleaning process is not effective, the surfaces of the wafer will be stained with fine lapping grit residue. Such residual grit may cause contamination problems during electrical device fabrication.

Cleaning of lapped silicon wafers is generally done in ultrasonic tanks using a caustic solution with or without a surfactant to assist in wetting and dispersing dirt. The total processing time to produce sufficiently clean wafers may be thirty or more minutes.

A disadvantage of the duration of the cleaning process is that prolonged exposure to ultrasonics causes damage to the wafers. The extensiveness of the damage increases as the exposure time to the ultrasonics increases.

Another disadvantage of the cleaning process duration is delay in providing feedback information to the lapping operator concerning the quality of the lapped wafers (e.g., Total Thickness Variation measurements, presence of scratches, etc.). Such information allows the operator to make any needed corrective adjustments to the lapping process for avoiding damage to additional wafers, but can generally only be provided after the wafers are cleaned. The longer the delay in providing the feedback information, the larger the number of damaged wafers before corrective actions can be taken.

SUMMARY OF THE INVENTION

Among the several objects of this invention may be noted the provision of an improved apparatus and method for cleaning semiconductor wafers; the provision of such an apparatus and method which uniformly cleans the wafers; the provision of such an apparatus and method which minimizes the duration required for cleaning the wafers; the provision of such an apparatus and method which minimizes the duration the wafers are exposed to ultrasonics; and the provision of such an apparatus and method which maximizes the effectiveness of ultrasonics in the cleaning process.

Generally, apparatus of the present invention for cleaning semiconductor wafers comprises a tank for containing a liquid, means for directing sonic energy through liquid contained in the tank, a wafer holder, and a wafer-moving mechanism. The wafer holder is adapted for holding the semiconductor wafer in a generally upright position within the tank with a central region of the semiconductor wafer being at approximately the same level as the surface of liquid contained in the tank. The wafer-moving mechanism is constructed for engaging the semiconductor wafer in the wafer holder to impart a rotating motion to the semiconductor wafer in the tank and to impart a generally up and down reciprocating motion to the semiconductor wafer so that the central region of the wafer repeatedly passes through the surface of the liquid.

In another aspect of the present invention, apparatus for processing semiconductor wafers comprises a tank for containing a liquid, a wafer holder, and a wafer-moving mechanism. The wafer holder is adapted for holding the semiconductor wafer in a generally upright position within the tank with at least a portion of the semiconductor wafer being immersed in the liquid within the tank. The wafer-moving mechanism is constructed for engaging the semiconductor wafer in the tank to impart a rotating motion to the semiconductor wafer relative to the tank and to impart a generally up and down reciprocating motion to the semiconductor wafer relative to the tank.

In another aspect of the present invention, a method of cleaning a semiconductor wafer comprises placing liquid in a bath, a gas-liquid-interface being defined at the surface of the liquid, placing the semiconductor wafer in the bath so that it is oriented in a generally upright position with at least part of the wafer in the liquid and below the gas-liquid-interface, directing sonic energy through the liquid, varying at least one of the following steps: (a) the position of the semiconductor wafer, or (b) the level of liquid in the bath relative to the semiconductor wafer so that the entire surface of the wafer passes through the gas-liquid-interface, and repeating the varying step a plurality of times.

In another aspect of the present invention, a method of processing a semiconductor wafer comprises placing liquid in a bath, a gas-liquid-interface being defined at the surface of the liquid, placing the semiconductor wafer in the bath so that it is oriented in a generally upright position with at least part of the wafer being in the liquid and below the gas-liquid-interface, and rotating the semiconductor wafer while moving the semiconductor wafer in a generally up and down reciprocating motion relative to the tank.

Other objects and features will be in part apparent and in part pointed out hereinafter.

BRIEF DESCRIPTION OF THE DRAWINGS

FIG. 1 is a schematic side elevational view of a wafer cleaning apparatus of the present invention with portions broken away to show detail;

FIG. 2 is a sectional view taken along the plane of line 2—2 of FIG. 1 with portions broken away to show detail;

FIG. 3 is a sectional view similar to the view of FIG. 2 but showing a semiconductor wafer rotated clockwise a few degrees and in a lowered position;

FIG. 4 is an enlarged front elevational view of a wafer moving mechanism of the apparatus of FIG. 1;

FIG. 5 is a top plan view of the wafer moving mechanism of FIG. 4; and

Corresponding reference characters indicate corresponding parts throughout the several views of the drawings.

DESCRIPTION OF THE PREFERRED EMBODIMENT

Figure 6:
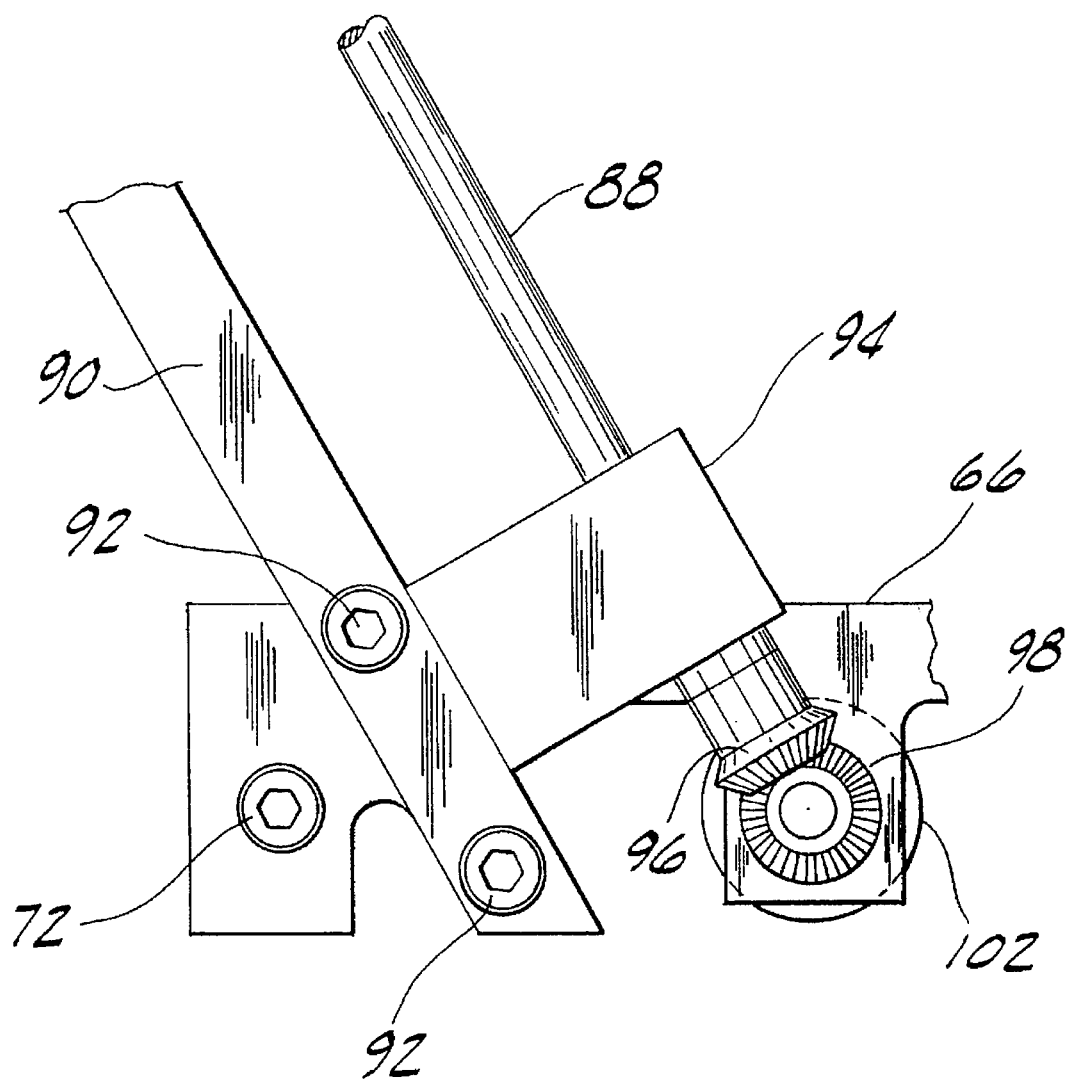
FIG. 6 is a partial rear elevational view of the wafer moving mechanism of FIG. 4.

Referring now to the drawings, and first more particularly to FIGS. 1–3, apparatus of the present invention for cleaning semiconductor wafers is indicated in its entirety by the reference numeral 20. The wafer cleaning apparatus 20 comprises an ultrasonic tank, generally indicated at 22, a cassette, generally indicated at 24, for holding a plurality of semiconductor wafers W, and a wafer-moving mechanism, generally indicated at 26.

Applicants have concluded that cleaning of semiconductor wafers in an ultrasonic tank is most effective at the surface of the liquid in the tank, i.e., at the gas-liquid-interface. In other words, ultrasonic energy will clean a portion of a semiconductor wafer located at or just slightly below the gas-liquid-interface at a faster rate than it will clean a portion of the semiconductor wafer well below the gas-liquid-interface. The principal of operation of the wafer-cleaning apparatus 20 is based on this conclusion.

The tank 22 comprises a generally horizontal bottom 28, a front wall 30, a back wall 32, two side walls 34, 36 extending between the front and back walls, a weir 38 generally parallel to the front and back walls and extending between the side walls, and a plurality of ultrasonic or megasonic transducers 40 (shown schematically in FIGS. 1–3) attached to the underside of the bottom. The front wall 30, weir 38, side walls 34, 36, and bottom 28 define a bath, generally indicated at 42, for holding a suitable cleaning liquid. Preferably, the cleaning liquid is a solution of 2% by volume concentrated KOH (45 wt %) and 2% by volume of a commercially available detergent (e.g., Vector HTC, available from Intersurface Dynamics of Bethel, Conn.). Also preferably, the bath temperature is about 60° C. during cleaning of the wafers. The megasonic transducers 40 constitute means for directing sonic energy through liquid contained in the bath 42. The weir 38, back wall 32, side walls 34, 36, and bottom 28 define an overflow receptacle, generally indicated at 44 in FIGS. 2 and 3. The liquid is preferably introduced into the bath 42 via an inlet port (not shown) in the bottom 28 of the tank 22, fills the bath 42, and flows over the weir 38 into the overflow receptacle 44. As long as liquid is being introduced into the bath 42, the weir maintains the liquid in the bath at a constant level. In other words, the gas-liquid-interface, indicated at 46, is maintained at a constant level 48. The overflow receptacle 44 has a drain (not shown) for draining liquid therefrom. The tank 22 is preferably a conventional ultrasonic tank, such as a model XHT-1014-6 ultrasonic tank commercially available from Crest Ultrasonics of Trenton, N.J., but with the weir lowered to lower the liquid level in the bath. Preferably, the ultrasonic tank 22 further includes a circulatory system (not shown) for filtering and recirculating the drained liquid back into the bath 42.

The cassette 24 constitutes a wafer holder for holding the semiconductor wafers W generally upright within the bath 22. Preferably, the cassette 24 is a conventional cassette, such as a model X4200-01 cassette, commercially available from Empak of Colorado Springs, Colo. The cassette 24 has end walls 50, a plurality of horizontal stringers 52 extending between the end walls, and a plurality of upright ribs 54 connected to and spaced at generally equal intervals along the stringers. The spaced upright ribs 54 define wafer receiving slots 56 (FIG. 1). The stringers 52 are adapted to engage the periphery of the semiconductor wafers W to limit lateral movement of the wafers (i.e., left and right movement of the wafers as viewed in FIGS. 2 and 3) when the wafers are received in the wafer receiving slots 56. The ribs 54 are adapted to engage the edge margins of faces of the semiconductor wafers W to limit longitudinal motion of the wafers (i.e., left and right movement of the wafers as viewed in FIG. 1). The cassette 24 preferably has an open bottom 58 (FIGS. 2 and 3) through which the wafers may contact the wafer-moving mechanism 26.

Referring now to FIGS. 4–6, the wafer-moving mechanism 26 has a generally rectangular cassette receiving platform, generally indicated at 60, and a camming mechanism, generally indicated at 62. The cassette receiving platform 60 is preferably of stainless steel and comprises an elongate front member 64, an elongate rear member 66, and two elongate side members 68, 70. The front and rear members 64, 66 are secured to ends of the side members 68, 70 by suitable screws 72 (only two of which are shown in FIG. 4). Preferably, upper edges of the members 64, 66, 68, 70 are beveled to receive the cassette 24. Feet 74 extend downwardly from the front and rear members 64, 66 to engage the bottom 28 of the tank 22 and thereby elevate and level the platform 60 above the bottom. Preferably, the feet 74 comprise screws threaded in vertical holes 76 (FIG. 5) through the front and rear members 64, 66. Turning of the screws 74 in the holes 76 adjusts the elevation of the cassette receiving platform 60 in the bath 42. Horizontally extending screws 78, threaded through the members 64, 66, 68, 70 of the cassette receiving platform 60, extend outward from the platform and press against the inner surfaces of the walls of the bath 42 to secure the wafer-moving mechanism 26 to the tank 22.

The camming mechanism 62 includes a driven shaft 80 extending along a generally horizontally axis X (FIGS. 1 and 5) between the front and rear members 64, 66 of the cassette receiving platform 60. A forward end 82 of the driven shaft 80 is journaled via a suitable bushing (not shown) in the front member 64. A rear end 84 of the driven shaft 80 extends through the rear member 66 and is journaled therein via a suitable bushing (not shown). Preferably, the driven shaft 80 is rotated by a suitable motor 86 (FIG. 4) having a shaft 88 which is generally perpendicular to the axis of the driven shaft. The motor 86 is secured to an elongate motor support 90 extending generally upward from and secured via screws 92 (FIG. 6) to the rear member 66 of the cassette receiving platform 60. Preferably, the motor shaft 88 and motor support 90 extend upward beyond the level of liquid in the bath 42 to keep the motor above the liquid. The lower end of the motor shaft 88 is journaled in and supported by a suitable bearing block 94. A drive bevel gear 96 (FIG. 6) keyed to a lower end of the motor shaft 88 meshes with a driven bevel gear 98 keyed to the rear end 84 of the driven shaft 80. Preferably, a suitable cover 99 (shown in FIG. 5, but removed in FIG. 6) is secured to the bearing block 94 and covers the gears 96, 98. Rotation of the motor shaft 88 rotates the driven shaft 80 about the axis X.

The camming mechanism 62 further includes forward and rear disc-shaped blocks 100, 102, respectively. The forward disc-shaped block 100 is keyed to the driven shaft 80 generally adjacent the front member 64 of the cassette receiving platform 60. The rear disc-shaped block 102 is keyed to the driven shaft 80 generally adjacent the rear member 66 of the cassette receiving platform 60. Two elongate rods 104 (FIG. 4) extend between the disc-shaped blocks 100, 102 generally parallel to the driven shaft 80. The ends of the rods 104 extend into holes (not shown) in the disc-shaped blocks. Preferably, tubes 106 of a suitable elastomeric material (e.g., Tygon®) surround the rods 104 and extend from the forward disc-shaped block 100 to the rear disc-shaped block 102. As described in greater detail below, the outer surfaces of the tubes 106 constitute camming surfaces 108 engageable with the periphery of each semiconductor wafers W. As shown in FIG. 4, the rods 104 are preferably positioned closely adjacent the driven shaft 80 so that the tubes 106 frictionally engage the shaft to prevent rotation of the tubes relative to the shaft. Thus, the disc-shaped blocks 100 and 102, rods 104, and tubes 106 rotate with the driven shaft 80. The tubes 106 are preferably sized and arranged such that when the edge of the wafer is in contact with the camming surface, the wafer edge does not touch the driven shaft 80 at any rotational position of the camming mechanism.

Referring to FIGS. 1–3, when the cassette 24 (with semiconductor wafers W held therein) is inserted in the bath 42 and placed on the cassette receiving platform 60, then bottom portions of the peripheries of the semiconductor wafers contact the camming surfaces 108 (i.e., the outer surfaces of the tubes 106). Since the camming surfaces 108 rotate with the driven shaft 80, rotation of the camming mechanism 62 causes the camming surfaces to revolve around (i.e., orbit) the axis X. The orbiting of the camming surfaces 108 causes the wafers W to reciprocate up and down between a raised position (shown in FIG. 2) and a lowered position (shown in FIG. 3). The camming surfaces 108 also frictionally engage the peripheries of the semiconductor wafers W to cause the wafers to roll on the camming surfaces and thereby counter-rotate relative to the rotation of the driven shaft 80. In other words, counter-clockwise rotation of the camming mechanism 62 (as viewed in FIGS. 2 and 3) and its associated camming surfaces 108 causes clockwise rotation of the semiconductor wafers. Thus, the orbiting of the camming surfaces 108 about the axis X simultaneously imparts an up and down reciprocating motion to and rotates the wafers W.

As discussed above, the weir 38 determines the level 48 of the gas-liquid-interface 46 in the bath 42. The cassette receiving platform 60 is vertically positioned within the bath 42 relative to the weir 38 such that centers C (FIGS. 2 and 3) of the semiconductor wafers W are at an upper level $L_1$ (FIG. 2) above the gas-liquid-interface 46 when the wafers are in their raised position and at a lower level $L_2$ (FIG. 3) below the gas-liquid-interface 46 when the wafers are in their lowered position. Preferably, the weir 38 and level of the platform 60 are selected so that the level 48 of the gas-liquid-interface 46 is generally midway between the upper level $L_1$ and the lower level $L_2$. Thus, the centers C of the semiconductor wafers W pass through the gas-liquid-interface 46 each time the wafers are raised or lowered.

In operation, semiconductor wafers W to be cleaned are placed upright in the cassette 24 within the wafer receiving slots 56. The cassette 24 and wafers W are then picked up (either manually or via a robot arm (not shown)) and placed in the bath 42 on the cassette receiving platform 60. With the cassette 24 positioned on the cassette receiving platform 60, at least one of the two camming surfaces 108 engages the edge of each semiconductor wafer W. Operation of the motor 86 rotates the camming mechanism 62 about the axis X to simultaneously reciprocate and rotate the semiconductor wafers W. The reciprocation action causes the center C of each semiconductor wafer W to move up and down between the upper level $L_1$ (FIG. 2) and the lower level $L_2$ (FIG. 3). The level 48 of cleaning liquid in the bath 42 is selected to be generally midway between the upper and lower levels $L_1$, $L_2$ when the cassette 24 is positioned on the cassette receiving platform 60 and the semiconductor wafers W are being reciprocated and rotated by the camming mechanism 62.

As the position of each semiconductor wafer W is varied (i.e., as the semiconductor wafer is reciprocated and rotated), sonic energy is directed through the cleaning liquid by the transducers 40 to sonically clean the wafers.

Preferably, the transducers 40 emit sonic energy in the range of 38 to 42 Khz. As explained above, cleaning of the semiconductor wafers W in the sonic bath 42 is most effective at or near the gas-liquid-interface 46. The position of each semiconductor wafer W relative to the constant level 48 of the gas-liquid-interface 46 and the simultaneous reciprocating and rotational motion of the wafer ensure that every portion of the wafer passes through the gas-liquid-interface during each complete rotation of the semiconductor wafer (i.e., as the wafer is rotated 360 degrees). Since the entire surface of the semiconductor wafer W passes through the gas-liquid-interface during each complete rotation of the wafer, every portion of the wafer is subjected to the most effective cleaning action for at least a fraction of the duration of such complete rotation. Preferably, rotation of the camming mechanism 62 rotates the semiconductor wafers W at a rate of at least approximately 8 rpm, and more preferably at a rate between approximately 12 and 18 rpm. The rotational rate of the semiconductor wafers W depends on the rotational speed of the driven axis 82, the outer diameter of the tubes 106, the distance between the axis X and the center of each rod 104, and the diameter of the semiconductor wafers. Because the camming mechanism 62 has two camming surfaces 108, each complete rotation of the camming mechanism results in two complete reciprocation cycles of the semiconductor wafers (i.e., the semiconductor wafers are moved up and down two times for every complete rotation of the camming mechanism). Preferably, the semiconductor wafers W are reciprocated up and down at a rate of at least approximately 20 cycles per minute, more preferably at a rate of at least 60 cycles per minute, and most preferably, at a rate of about 180 to 240 cycles per minute (i.e., twice the rotational speed of the camming mechanism). Subjected to these cleaning conditions, the semiconductor wafers are sufficiently cleaned in five to ten minutes. The rapid cleaning of the semiconductor wafers minimizes the exposure time to the ultrasonic energy and, therefore, minimizes ultrasonic damage to the wafers. The rapid cleaning also allows feedback information to be rapidly provided to the lapping operator so that any needed corrective adjustments to the lapping process can be timely made.

After the semiconductor wafers W are cleaned, the cassette 24 is lifted (either manually or via a robot arm) off the cassette receiving platform 60 and removed from the bath 42. Preferably, the cassette 24 is not fastened to the tank 22 or to the wafer moving mechanism 26 and no disconnection is necessary before removal of the cassette and semiconductor wafers W. Since the cassette 24 is not fastened to the tank or wafer moving mechanism, the cassette and wafers may be quickly and easily inserted in and removed from the bath. The weight of the cassette 24 is sufficient to keep the cassette stationary on the cassette receiving platform 60 as the semiconductor wafers W are reciprocated and rotated by the camming mechanism 62. Also, the camming mechanism 62 does not engage nor move the cassette 24. Thus, the semiconductor wafers W are reciprocated up and down and rotated independent of the cassette 24. Preferably, the reciprocation is sufficient to move the periphery of each semiconductor wafer W away from lower portions of the ribs 54 and the lower stringers 52 (FIG. 2) of the cassette 24 as the wafer is moved to its upper most position. Moving the wafer's periphery away from the ribs 54 and stringers 52 ensures that the ribs and stringers do not cause dead spots in the wafers (i.e., regions which are masked by the ribs and, therefore, not sufficiently cleaned).

Because the two camming surfaces 108 comprise spaced-portions of cylindric surfaces and not a single smooth continuous surface, the motion imparted to the semiconductor wafers W is somewhat bumpy which may result in some slipping between the camming surfaces and wafers. This slipping causes the rotational motion to be somewhat non-uniform which prevents marks which might otherwise occur if the motion would have a fixed pattern. Also, with this arrangement, orientation flats F of the semiconductor wafers W do not hinder rotation.

Although two camming surfaces are preferred, it is to be understood that a single tube-covered rod spaced from the driven shaft could be employed without departing from the scope of this invention. Alternatively, if a smooth (non-bumpy) motion is desirable, the camming surface could comprise a non-circular (e.g., elliptical) cylinder surrounding the driven shaft, or a circular cylinder surrounding the driven shaft and having a central axis eccentric to the axis X. If more agitation is desirable, three or more camming surfaces could be used.

Although imparting both a rotating and reciprocating motion to the semiconductor wafers W is the preferred method of repeatedly passing the entire surfaces of the wafers through the gas-liquid-interface, it is to be understood that other methods may be employed without departing from the scope of this invention. For example, the wafers could be held stationary in an ultrasonic bath and the liquid level could repeatedly be raised and lowered. Alternatively, the wafers could be rotated in the bath (without imparting an up and down reciprocating motion) and the liquid level could be repeatedly raised and lowered a small amount so that the liquid level repeatedly rises above and falls below the center of the wafers.

The wafer moving mechanism 26 of the present invention has been described as rotating and reciprocating semiconductor wafers in a bath for cleaning semiconductor wafers. However, it is to be understood that the mechanism may alternatively be used to rotate and reciprocate wafers in another type of cleaning process, an etching process or other semiconductor wafer shaping process.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for cleaning a semiconductor wafer comprising:
    a tank adapted to contain a liquid, said liquid having an upper surface; and
    means for directing sonic energy through liquid contained in the tank;
    a wafer holder for holding the semiconductor wafer in a position within the tank with a central region of the semiconductor wafer being about level with the surface of liquid contained in the tank; and
    a wafer-moving mechanism constructed for engaging the semiconductor wafer in the wafer holder to impart a rotating motion to the semiconductor wafer in the tank and to impart a reciprocating motion to the semiconductor wafer so that the central region of the wafer repeatedly passes through the surface of the liquid.

2. Apparatus as set forth in claim 1 wherein the wafer-moving mechanism is constructed for moving the semiconductor wafer relative to the wafer holder.

3. Apparatus as set forth in claim 1 wherein the wafer-moving mechanism is constructed for rotating the semiconductor wafer relative to the wafer holder and for repeatedly raising and lowering the semiconductor wafer relative to the wafer holder.

4. Apparatus as set forth in claim 3 wherein the wafer-moving mechanism is engageable with the periphery of the semiconductor wafer.

5. Apparatus as set forth in claim 3 wherein the wafer-moving mechanism is engageable with a bottom portion of the periphery of the semiconductor wafer.

6. Apparatus as set forth in claim 3 wherein the wafer-moving mechanism comprises at least one camming surface engageable with a bottom portion of the periphery of the semiconductor wafer.

7. Apparatus as set forth in claim 6 wherein the camming surface is rotatable about a generally horizontal axis of rotation, the camming surface being configured to impart both the rotating motion and the generally up and down reciprocating motion to the semiconductor wafer as the camming surface is rotated about the axis of rotation.

8. Apparatus as set forth in claim 7 wherein the camming surface is of an elastomeric material to frictionally engage the periphery of the semiconductor wafer.

9. Apparatus as set forth in claim 7 wherein rotation of the camming surface causes the semiconductor wafer to counter-rotate relative to the rotation of the camming surface.

10. Apparatus as set forth in claim 1 wherein the wafer-moving mechanism is constructed for rotating the semiconductor wafer at a rate of at least about 8 rpm and for reciprocating the semiconductor wafer at a rate of at least about 20 cycles per minute, each cycle comprising a single raising and a single lowering of the semiconductor wafer.

11. Apparatus as set forth in claim 1 wherein the wafer holder comprises a cassette constructed (1) for holding a batch of semiconductor wafers, (2) for quick insertion of the cassette and wafers into the tank, and (3) for quick removal of the cassette and wafers from the tank, the wafer-moving mechanism being so positioned within the tank that the wafers engage the wafer-moving mechanism as the cassette and wafers are inserted into the tank.

12. Apparatus for processing semiconductor wafers comprising:
    a tank for containing a liquid; said liquid having an upper surface;
    a wafer holder for holding the semiconductor wafer in the tank with at least a portion of the semiconductor wafer being immersed in the liquid within the tank; and
    a wafer-moving mechanism constructed for engaging the semiconductor wafer in the tank to rotate the semiconductor wafer relative to the tank and to reciprocate the semiconductor wafer relative to the tank so that at least a central region of the wafer repeatedly passes through the surface of the liquid.

13. Apparatus as set forth in claim 12 wherein the wafer-moving mechanism comprises at least one camming surface engageable with a bottom portion of the periphery of the semiconductor wafer and rotatable about a generally horizontal axis of rotation, said camming surface being configured to impart both the rotating motion and the generally up and down reciprocating motion to the semiconductor wafer as the camming surface is rotated about said axis of rotation.

14. Apparatus as set forth in claim 13 wherein the camming surface comprises a surface portion of a cylinder eccentrically rotated about said axis of rotation.

15. Apparatus as set forth in claim 14 wherein the camming surface constitutes a first camming surface, the wafer-moving mechanism further comprising a second camming surface, the first camming surface comprising a surface portion of a first cylinder eccentrically rotated about said axis of rotation, the second camming surface comprising a surface portion of a second cylinder eccentrically rotated about said axis of rotation.

16. Apparatus as set forth in claim 15 wherein the first and second cylinders each have a central axis generally parallel to said axis of rotation, the central axes being spaced generally equidistant from the axis of rotation.

17. Apparatus as set forth in claim 16 wherein each of the first and second cylinders comprises a rod covered with an elastomeric material for frictionally engaging the periphery of the semiconductor wafer.

18. Apparatus as set forth in claim 12 further comprising means for directing sonic energy through liquid contained in the tank.

* * * * *